(12) United States Patent
Misra et al.

(10) Patent No.: US 7,482,286 B2
(45) Date of Patent: Jan. 27, 2009

(54) METHOD FOR FORMING DIELECTRIC OR METALLIC FILMS

(75) Inventors: Ashutosh Misra, Plano, TX (US); Matthew Fisher, Allen, TX (US); Benjamin Jurcik, Richardson, TX (US); Christian Dussarrat, Tsukuba (JP); Eri Tsukada, Ibaraki (JP); Jean-Marc Girard, Paris (FR)

(73) Assignee: L'Air Liquide, Societe Anonyme A Directoire et Conseil de Surveillance pour l'Etude et l'Exploitation des Procedes Georges Claude, Paris (FR)

( * ) Notice: Subject to any disclaimer, the term of this patent is extended or adjusted under 35 U.S.C. 154(b) by 0 days.

(21) Appl. No.: 10/591,629

(22) PCT Filed: Feb. 24, 2005

(86) PCT No.: PCT/IB2005/000522

§ 371 (c)(1),
(2), (4) Date: Sep. 5, 2006

(87) PCT Pub. No.: WO2005/093126

PCT Pub. Date: Oct. 6, 2005

(65) Prior Publication Data
US 2007/0190807 A1    Aug. 16, 2007

(30) Foreign Application Priority Data
Jun. 30, 2004    (JP)    ............... 2004-193710

(51) Int. Cl.
H01L 21/469 (2006.01)
H01L 21/8242 (2006.01)
H01L 21/31 (2006.01)
H01L 21/38 (2006.01)
H01L 21/22 (2006.01)
H01L 21/4763 (2006.01)

(52) U.S. Cl. .............. 438/778; 438/240; 438/287; 438/477; 438/565; 438/623; 438/778; 438/786; 438/791; 438/792; 438/907; 257/E21.274

(58) Field of Classification Search ............... 438/791, 438/778, 623, 477, 565, 786, 792, 240, 287, 438/907; 257/E21.274
See application file for complete search history.

(56) References Cited

U.S. PATENT DOCUMENTS 5,470,398 A    11/1995   Shibuya et al.

(Continued)

FOREIGN PATENT DOCUMENTS

EP    1 028 458    8/2000

(Continued)

OTHER PUBLICATIONS

International Search Report for PCT/IB2005/000522.

(Continued)

Primary Examiner—David Vu
Assistant Examiner—Arman Khosraviani
(74) Attorney, Agent, or Firm—Brandon Clark

(57) ABSTRACT

Method for producing a metal silicon (oxy)nitride by introducing a carbon-free silicon source (for example, (SiH3)3N), a metal precursor with the general formula MXn (for example, Hf(NEt2)4), and an oxidizing agent (for example, O2) into a CVD chamber and reacting same at the surface of a substrate. MSiN, MSiO and/or MSiON films may be obtained. These films are useful are useful as high k dielectrics films.

19 Claims, 6 Drawing Sheets

U.S. PATENT DOCUMENTS

| | | | |
|---|---|---|---|
| 6,399,208 B1 | 6/2002 | Baum et al. | |
| 6,613,695 B2* | 9/2003 | Pomarede et al. | 438/767 |
| 6,780,704 B1* | 8/2004 | Raaijmakers et al. | 438/239 |
| 6,806,145 B2* | 10/2004 | Haukka et al. | 438/287 |
| 6,831,315 B2* | 12/2004 | Raaijmakers et al. | 257/296 |
| 6,921,702 B2* | 7/2005 | Ahn et al. | 438/287 |
| 6,958,277 B2* | 10/2005 | Pomarede et al. | 438/287 |
| 6,960,537 B2* | 11/2005 | Shero et al. | 438/775 |
| 6,984,591 B1* | 1/2006 | Buchanan et al. | 438/778 |
| 7,056,835 B2* | 6/2006 | Pomarede et al. | 438/769 |
| 2001/0024387 A1* | 9/2001 | Raaijmakers et al. | 365/200 |
| 2002/0098627 A1* | 7/2002 | Pomarede et al. | 438/149 |
| 2003/0049942 A1* | 3/2003 | Haukka et al. | 438/778 |
| 2003/0072975 A1* | 4/2003 | Shero et al. | 428/704 |
| 2003/0111678 A1* | 6/2003 | Colombo et al. | 257/240 |
| 2003/0207549 A1 | 11/2003 | Jeng | |
| 2004/0121620 A1* | 6/2004 | Pomarede et al. | 438/785 |
| 2004/0147101 A1* | 7/2004 | Pomarede et al. | 438/591 |
| 2004/0175586 A1* | 9/2004 | Raaijmakers et al. | 428/469 |
| 2004/0198069 A1 | 10/2004 | Metzner et al. | |

FOREIGN PATENT DOCUMENTS

| | | |
|---|---|---|
| JP | 2000 272283 | 2/2002 |
| WO | WO 2004 010466 | 1/2004 |

OTHER PUBLICATIONS

Patent Abstracts of Japan, vol. 2002, No. 06, Jun. 4, 2002 & JP 2002 053960, Feb. 19, 2002.

Ohshita, Y. et al. $Hf_{1-x}Si_xO_2$ *deposition by metal organic chemical vapor deposition using the $Hf(NEt_2)_4/SiH(Net_2)_3/O_2$ gas system*, Preparation and Characterization, Elsevier, Sequoia, NL, vol. 416, No. 1-2, Sep. 2, 2002, pp. 208-211.

Japan Journal of Applied Physics, vol. 42, No. 6A, pp. L578-L580, Jun. 2003.

Applied Physics Letters, vol. 80, No. 13, pp. 2362-2364, Apr. 2002.

* cited by examiner

METHOD FOR FORMING DIELECTRIC OR METALLIC FILMS

This application is a 371 of International PCT Application PCT/IB2005/000522, filed Feb. 24, 2005.

BACKGROUND

Manufacturing of semiconductor devices employs a thin gate dielectric (typically silicon dioxide) between the underlying silicon substrate and the gate electrode. Depositing a thin dielectric film on a silicon substrate forms a gate dielectric. Typical processes for growth of dielectric films include oxidation, chemical vapor deposition and atomic layer deposition processes. As integrated circuit devices shrink, the thickness of the gate dielectric needs to shrink proportionally. However, semiconductor manufacturers have reached the limit to which the thickness of conventional gate dielectric materials can be decreased without compromising the electrical characteristics. Rather than degrading the dielectric properties by using a silicon dioxide dielectric that is only a few atomic layers thick, equivalent dielectric performance can be achieved by substituting the silicon dioxide for a thicker layer of a new material exhibiting a higher dielectric constant. Therefore, new compositions or methods to produce a dielectric film with a higher dielectric constant than silicon dioxide (referred to as "high-k dielectrics") are required. These "high-k dielectrics" must have a low leakage current through the gate dielectric. Thus, it is desirable to develop new compositions and methods of depositing dielectric films with the required higher dielectric properties so that films with more than one or two layers of atoms can be deposited. Due to the requirements for thin dielectric films, having uniform coverage of material that is very high quality is critical to the performance of the gate dielectric.

Depositing a thin metallic film, with the generic formula $M_xSi_yN_z$, on a high-k film or a low-k film may be useful either as an electrode such as a gate electrode or a barrier layer. Typical processes for growth of metallic films include chemical vapor deposition, pulse chemical vapor deposition and atomic layer deposition processes. As integrated circuit devices shrink, the use of metal-based dielectric films raises issues relative to the compatibility of the use of these materials and polycrystalline silicon (poly-Si), so far used as a gate electrode. A new class of metal-based gate electrode is today considered to overcome issues such as depletion, cross-contamination. In DRAM, such metal electrode material is currently used.

The application of metal silicon nitrides as a barrier layer sandwiched between a Cu interconnect or electrode and a low-k dielectric film is another example of the application of compounds that contain metal and silicon. The metal nitrides have a good conductivity and can also effectively prevent contamination of low-k dielectric film by Cu. Moreover, the low resistance of the barrier layer is advantageous from the standpoint of lowering RC delay.

Metal silicon nitride films have heretofore been formed, for example, by CVD using ammonia and metal halide (e.g., $TiCl_4$, $TaCl_5$). This approach, however, requires a high thermal budget and a high process temperature (>650° C.) and is not compatible with back-end-of-line (BEOL) processes.

To overcome such drawbacks, it is known from U.S. Pat. No. 6,602,783 to use ammonia and an amino metal precursor (e.g., TDMAT, TDEAT, TBTDET, TAIMATA) for metal nitride film formation by CVD. The use of such amino metal precursors has been found to improve the film properties of, for example, CVD-TiSiN films. It has also been found that the formation of metal nitride film doped with small amounts of silicon by CVD using an amino metal precursor, silane $SiH_4$, and ammonia is advantageous in terms of improving the barrier properties. $SiH_4$, however, has a high vapor pressure and is pyrophoric:any $SiH_4$ leak may be a safety issue. When, on the other hand, dialkylaminosilane $Si(NR_1R_2)_4$ is used as the silicon source in place of silane, there is a strong likely hood of incorporation of large amounts of carbon into the film and of an increased barrier layer resistance.

Of particular interest is the formation of metal silicon oxynitride ("MSiON") films, metal silicate ("MSiO") or a metallic film ("MSiN"), which can be either a metal nitride, metal silicide, metal silicon nitride. Forming a MSiON or a MSiO dielectric or a metallic film typically involves feeding the relevant chemicals among a metal source, a silicon source, an oxygen source and a nitrogen source (collectively referred to herein as the "precursors") in the proper relative amounts to a deposition device wherein a substrate is held at an elevated temperature. Forming the precursors are fed to a deposition chamber through a "delivery system." A "delivery system" is the system of measuring and controlling the amounts of the various dielectric precursors being fed to the deposition chamber. Various delivery systems are known to one skilled in the art. Once in the deposition chamber, the dielectric precursors react to deposit a dielectric film on the silicon substrate in a "forming" step. A "forming" step or steps, as used in this application, is the step or steps wherein materials are deposited on the substrate or wherein the molecular composition or structure of the film on the substrate is modified. The "desired final composition" of the film is the precise chemical composition and atomic structure of the layer after the last forming step is complete. Compounds of hafnium, such as hafnium oxides, hafnium silicates and hafnium silicon oxynitrides are currently the most promising high-k gate dielectric choices. Compounds of tantalum, titanium and tungsten, either as metal nitride, metal silicide or metal silicon nitride are the most promising barrier or electrode materials. The metal source for the forming process is typically a liquid precursor or a liquid precursor solution containing the desired metal in a solvent. Similarly, the silicon sources available in the art prior to the current invention typically use a liquid precursor containing the desired silicon compound in a solvent.

It is disclosed, e.g. in Jpn. J. Appl. Phys., Vol. 42, No. 6A, pp. L578-L580, June 2003, Applied Physics Letters, Vol. 80, No. 13, pp. 2362-2364, April 2002, United States Published Applications 2003/0111678, 2003/0207549, or U.S. Pat. No. 06399208, Japanese patent application published as 2000272283, various processes to make dielectric films. However, all of these films suffer from one or more of the disadvantages discussed below.

Some gate dielectric-forming processes require multiple forming steps. For instance, a dielectric film may be formed by depositing a metal and silicon on a substrate in a first step followed by a second "post deposition step" wherein the composition or structure of the deposited metal/silicon film is modified to achieve the desired final composition of a MSiON gate dielectric film. An example of a post deposition step is rapid thermal annealing in an environment that is filled of nitrogen or ammonia. Because control of the film composition is important in dielectric film deposition processes, the fewer the steps, the better the control of the process, and the higher the quality (reflected by dielectric constant, density, contamination, composition and other quality control properties) and conformality (the ability of the film to evenly deposit on all surfaces and shapes of substrate) of the dielectric film.

It is known in the art that any silicon sources that contain carbon in the ligands can lead to carbon in the film and result in degraded electrical properties, either enhancing the leakage current for insulating films or reducing the conductivity for metallic films. Furthermore, chlorine incorporated in the films is undesirable due to its harmful effect on the electrical properties of the film and the stability of the chlorine in the film (the stability makes it hard to remove chlorine from the dielectric film). Also, the presence of chlorine in the silicon or metal source generates chloride based particulates in the reaction chamber and deposits in the exhaust system. Thus, to achieve the ideal electrical properties and to minimize particulate generation and tool downtime due to exhaust system cleaning, it is desirable to deposit dielectric films from precursors free of carbon or chlorine in the atomic structure.

The physical properties of a film may be modified by the metal (M) to silicon (Si) ratio, or (M/Si). It is desirable to control the M/Si ratio over a broad range. Thus, it is important to be able to vary the metal and silicon feed independently to achieve the broadest possible M/Si ratios. Some processes use a silicon source precursor that also contains some amount of the metal to be deposited. However, that changes in the metal-containing silicon source precursor feed rate changes the total amount of the metal fed to the process (due to the metal contained in the silicon precursor). This limits the controllability of the deposition process because the silicon feed rate cannot be changed without changing the total amount of metal being fed to the deposition chamber. Furthermore, the ratio of M/Si that can be fed is limited by the composition of the metal in the silicon source precursor. Thus a change in the desired M/Si ratio may require changing precursor solutions being fed to the process.

Vaporizing silicon precursor streams can also lead to problems with film composition control. Some processes in the art use a vaporizer to vaporize the liquid silicon source. The vaporized stream is then fed to the deposition chamber. When the metal source and the silicon source are supplied in liquid form, they must both be vaporized before being introduced into the deposition chamber. Vaporizing two different streams can lead to variable feed concentrations and formation of silicon or metal residues in the vaporizer that can adversely affect the conformality of the film composition. Differences in vaporization of the silicon and metal sources can also lead to compositional gradients in the dielectric.

Bubbling a carrier gas through a liquid precursor can also cause quality problems. In some processes, a silicon source is fed by bubbling a carrier gas through a liquid silicon source. A vaporizer is not used in these processes because the vapor pressure of the silicon source is high enough to be transported as a vapor in a mixture with the carrier gas. In these processes, the composition of the stream transporting the silicon source to the deposition chamber can vary with temperature and pressure in the bubbling system. This variability in stream composition leads to variability in the composition of the dielectric film, which is a significant quality control issue.

For the foregoing reasons, it is desirable to form a film of the final desired composition in a single forming step. Furthermore, the film should minimize chlorine and carbon content in the molecular structure. It is also desirable to use a silicon source that is free of any deposition metals so the silicon source feed and the metal source feed may be independently controlled. Finally, it is desirable to have a silicon source that is in the vapor phase at process feed conditions to avoid the need to vaporize a liquid silicon source or bubble a carrier gas through a liquid source.

SUMMARY

It is an aim of the invention to provide methods and compositions that satisfy the need to form a thin film with excellent electrical qualities and high conformality, and which avoid using multiple forming steps to obtain uniform coverage and high conformality. Another aim of the invention is to provide a film that minimizes chlorine and carbon contents, both of which can degrade the electrical properties of the film. A further aim of the invention is to provide the ability to control the M/Si ratio in the films over a broad range without changing precursor solutions. Still another aim is to avoid quality and conformality issues that can occur when vaporizing a liquid precursor solution containing multiple components or bubbling a carrier gas through a liquid silicon source.

The film according to the present invention is formed by vaporizing a metal source followed by feeding at least one precursor (precursors selected from the group comprising the following sources: vaporized metal source, silicon source, oxygen source, and/or nitrogen source) to a deposition device, and forming a film with the desired final composition in a single forming step. There is usually no need for a post deposition step to achieve the desired final composition of the film.

According to a preferred embodiment, a vapor phase silicon precursor and a liquid phase metal precursor are used for the deposition of films having the desired stoichiometry. The vapor phase silicon precursor has to be sufficiently volatile at temperatures above 15° C. to supply the process as a vapor avoiding the bubbling of a carrier gas through a liquid or heating in a vaporizer. This eliminates the control and quality problems associated with the vaporization of two precursors (a metal containing precursor and a silicon containing precursor) or bubble a carrier gas through a liquid to feed the silicon source. In addition, the vapor phase silicon precursor is not coordinated to a metal allowing independent control over feeding of the metal source and the silicon source. Thus, the M/Si ratio can be easily varied over a wide range without having to mix new precursor solutions and recalibrate the process to the new precursor mixture. Furthermore, the vapor phase silicon precursor is carbon and chlorine free, hence dramatically reducing the undesirable effects of carbon and chlorine in the dielectric film. Finally, according to the invention a dielectric film of the desired final composition is produced in a single step.

The metal source is typically a liquid precursor or a liquid precursor solution. The liquid phase precursor is injected into a system that vaporizes it into a gas phase. The vaporized precursor enters the deposition chamber where deposition occurs at an elevated temperature.

The silicon precursor and the metal precursor are simultaneously injected in the deposition chamber. According to an embodiment of the invention a mixture of inert gas such nitrogen, argon, or the like and the silicon precursor n gaseous phase may be used. The mixture may comprise preferably between about 1/1000 vol. To about 1000/1 vol. of precursor to inert gas. Preferably the ratio of flow rates of the metal source to the silicon source and/or the inert (e.g. nitrogen) gas source shall be comprised between 100/1 to 1/100, most preferably 1/1 to 1/20. The ratio of flow rate of the metal source to the flow rate of oxygen source shall be comprised preferably between 10/1 to 1/500, most preferably 1/1 to 1/100. Preferably, the silicon precursor source shall be free from any carbon chlorine, and/or deposition metal atoms in the molecular structure of the compound of said silicon source. It shall comprise preferably at least one silyl ($SiH_3$) ligand. The following molecules are examples of silicon precursors which may be used according to the invention:

1) Trisilylamine;

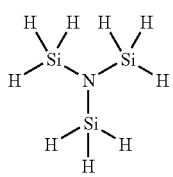

2) Disilylamine;

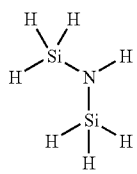

3) Silylamine;

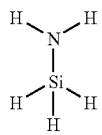

4) Tridisilylamine;

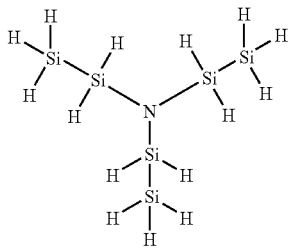

5) Aminodisilylamine;

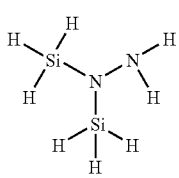

6) Tetrasilyldiamine;

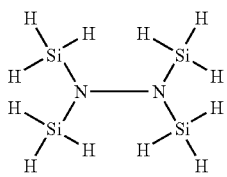

7) Disilane derivatives, wherein any H bonded to N may be replaced with a $SiH_2$—$SiH_3$.

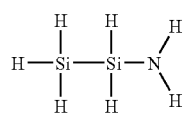

8) Trisilane and its derivatives.

Oxygen and nitrogen containing gases may also be injected into the deposition chamber simultaneously with the vaporized metal precursor and the silicon precursor vapor phases. Preferably, all the molecules of the gases and vapor phase products introduced will be carbon and/or chlorine free molecules.

When an oxygen source is used, it may comprise oxygen, ozone, etc . . . the nitrogen source and/or the oxygen source may also comprise at least one silyl ($SiH_3$) ligand.

The reaction of the precursors in the deposition chamber leads to the formation of a film on the silicon substrate. The composition of the film can be precisely controlled by precisely controlling the flow rates of each of the precursors independently. The feed rates of the silicon and metal sources are independently controllable, thus the M/Si ratio of the resulting film is controllable over a wide range without changing the composition of the metal source or the silicon source.

The reaction of the precursors in the deposition chamber forms a film of the desired final composition in a single reaction step. There is no requirement for a post deposition step wherein the composition of the dielectric film is modified by a step after the dielectric precursors are deposited on the substrate.

Because the silicon, oxygen and nitrogen sources in this invention are all carbon and chlorine free, the resulting film has excellent properties, i.e. a high dielectric constant for gate dielectrics or excellent conductivity as for metallic films.

Figure 6:
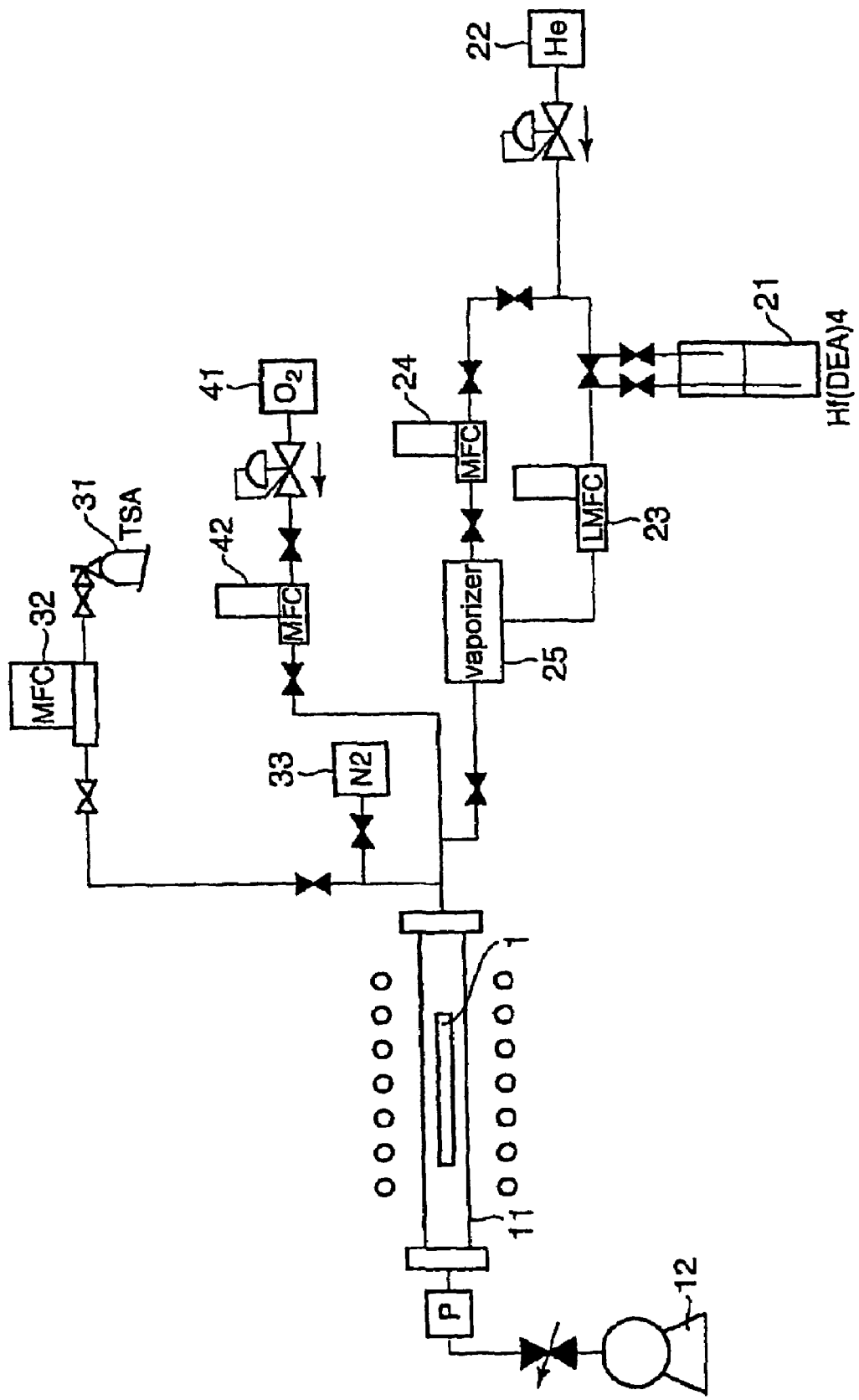
FIG. 6 is a schematic drawing of the gas distribution system to the CVD tool used in Example 1 of the present invention.
Figure 7:
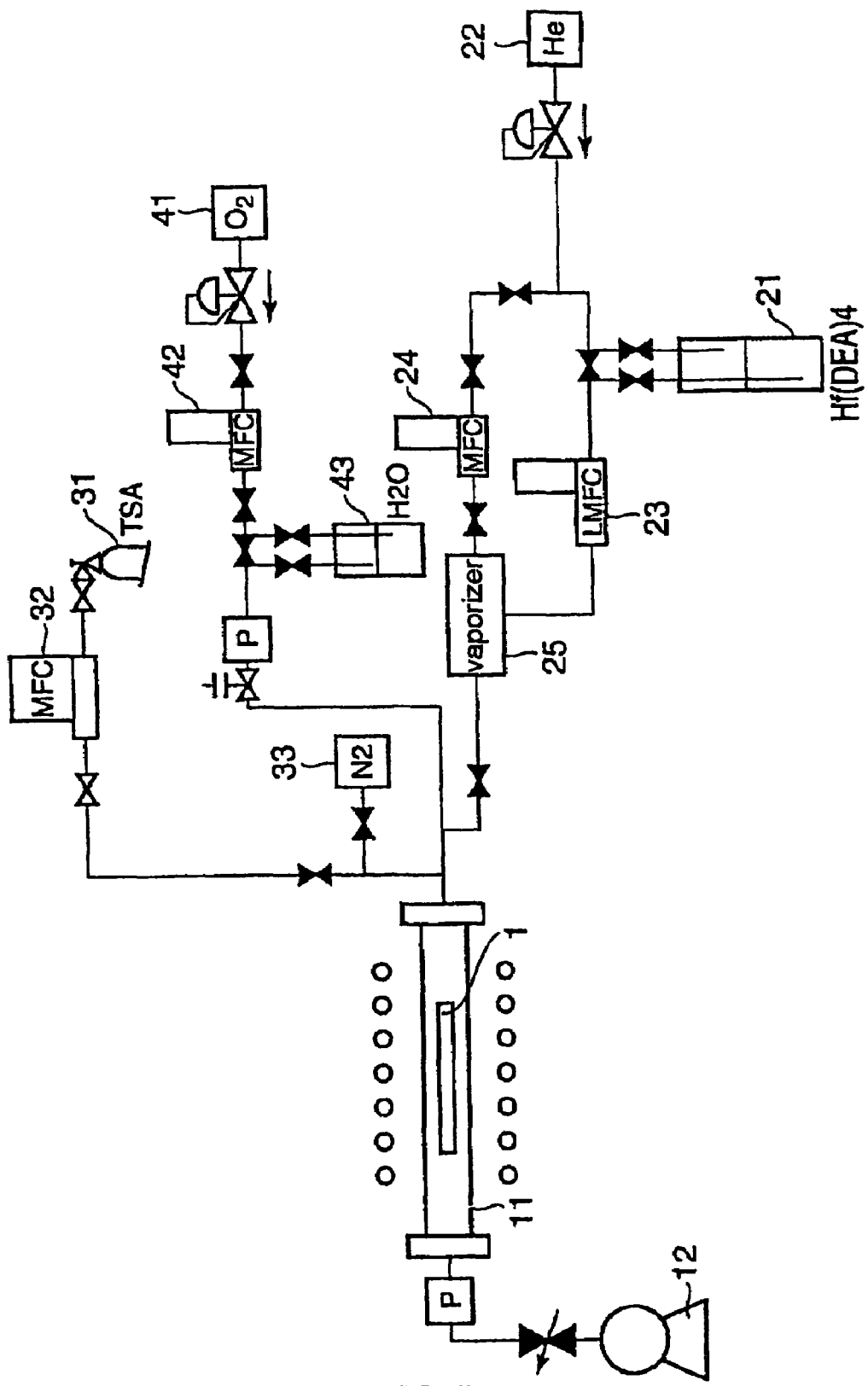
FIG. 7 is a schematic drawing of the gas distribution system to the CVD tool used in Example 2 of the present application.
Figure 8:
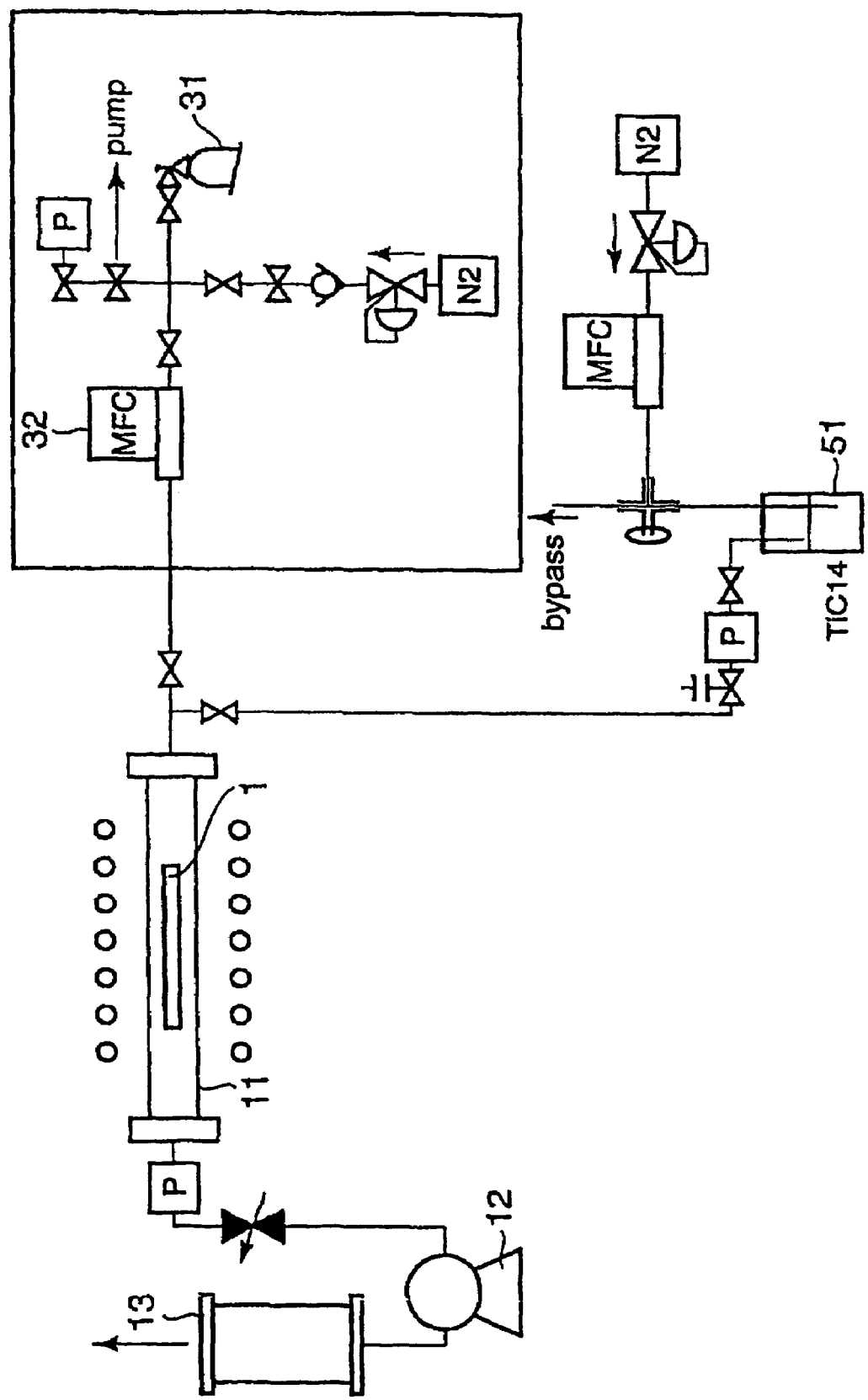
FIG. 8 is a structural drawing of the gas distribution system to the CVD tool used in Example 3 of the present application.

On FIGS. 6, 7, 8 the following reference numbers have the following meaning:

| | |
|---|---|
| 1 | silicon wafer |
| 11 | CVD chamber |
| 12 | pump |
| 13 | adsorber |
| 21 | liquid container |
| 22 | He gas |
| 23 | liquid mass flow controller |
| 24 | mass flow controller |
| 25 | vaporizer |
| 31 | bottle |
| 32 | mass flow controller |
| 33 | $N_2$ gas |
| 41 | $O_2$ gas |
| 42 | mass flow controller |
| 43 | bubbler |
| 51 | bubbler |

DESCRIPTION OF THE PREFERRED EMBODIMENT

The present invention is directed to a method of forming and composition of an MSiON insulating film on semiconductor substrate and to the dielectric film made according to this process. The present invention is applicable to chemical vapor deposition and atomic layer deposition processes as well as others known to the man skilled in the art.

Figure 2:
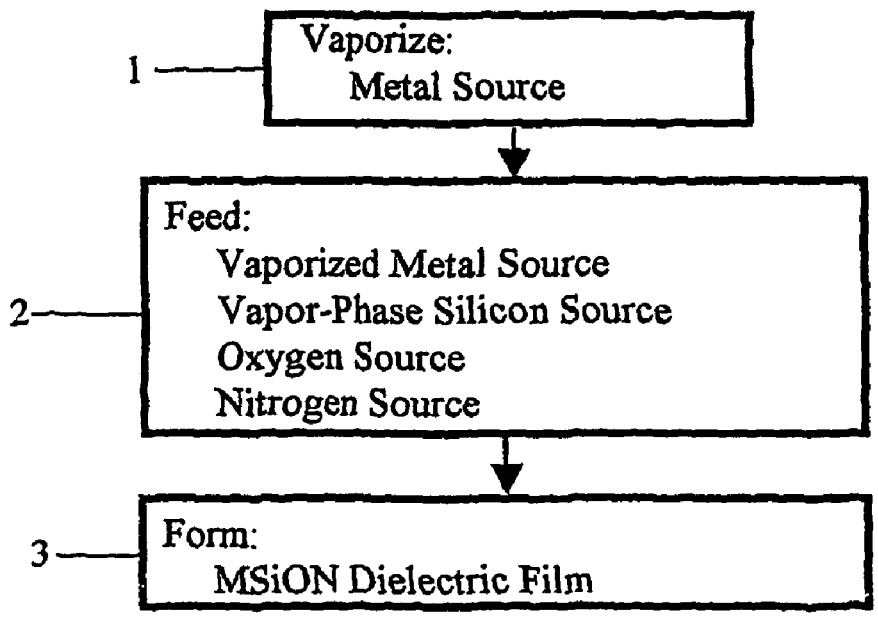
FIG. 2 is a flow chart of the steps of the method according to the invention for forming a MSiON insulating film.

Referring to the MSiON method of FIG. 2, the vaporizing step 1 comprises vaporizing a metal source to form a vaporized metal source. The metal source of one preferred embodiment is a precursor solution in liquid phase, preferably a dialkylamino, an alkoxy, or an inorganic compound of hafnium (Hf), zirconium (Zr), titanium (Ti), niobium (Nb), tantalum (Ta), scandium (Sc), yttrium (Y), lanthanum (La), gadolinium (Gd), europium (Eu), or praseodymium (Pr) or any another lanthanide (Ln). Preparing and vaporizing the liquid phase metal precursor solution is carried out in commercially available equipment under appropriate conditions known to one skilled in the art.

Referring again to the MSiON method of FIG. 2, during the feed step 2 a silicon source, an oxygen source, and a nitrogen source (collectively referred to as the dielectric precursors) are fed to a deposition chamber where a substrate (on which deposition is needed) is placed at an elevated temperature. The deposition chamber is typically maintained between about 300 to about 900° C. Preferably the surface of the work piece in the deposition chamber will be between about 500 to about 600° C. The feeding of the dielectric precursors is effectively concurrent (atomic layer deposition involves high-speed sequential pulses of feed materials, which for the purposes of this invention is preferably effectively concurrent).

Referring to the MSiON method of FIG. 2, during the feed step 2 of the MSiON method, the silicon source is controllably injected into the deposition chamber effectively concurrent with the vaporized metal source and the other dielectric precursors or silicon film components. In one preferred embodiment, a silicon source is in the vapor phase at process feed conditions. That is, the silicon source of one preferred embodiment has a vapor pressure of greater than approximately 50 torr at 20° C., sufficient to exist in the vapor phase in the feed control system without the need for vaporization or bubbler equipment in the delivery system. Trisilylamine, one preferred silicon source, may be stored as a liquid, but has sufficient vapor pressure (greater than 300 torr vapor pressure at 25° C.) to be in the vapor phase in the delivery system without the need to use a vaporizer or bubbler system. Because the silicon source is in the vapor phase, it can be accurately measured and controlled with conventional devices known in the art, and is not affected by deposits in a vaporizer or swings in feed conditions during vaporization of the silicon or metal source.

Still referring to the MSiON method of FIG. 2, preferred embodiments of the feed step 2 include, but are not limited to, the use a silicon source absent carbon and/or chlorine in the molecular structure. Thus, the dielectric film has a minimum amount of contained carbon and chlorine, resulting in the optimum electrical properties.

Still referring to the MSiON method of FIG. 2, preferred embodiments of the feed step 2 include, but are not limited to, feeding the oxygen and nitrogen sources into the deposition chamber concurrently with the silicon source. Furthermore, the vaporized metal source is also fed concurrently in the feed step 2. Various preferred embodiments of the MSiON method use nitrogen sources that are free of carbon and/or chlorine in their molecular structures. It is not required that nitrogen be fed as a separate stream. The nitrogen source can be the same as the metal source, the silicon source, or the oxygen source. Preferred oxygen sources of the current invention are also free of carbon and/or chlorine in their molecular structures. Preferred embodiments include, but are not limited to oxygen, nitrous oxide, and/or ozone as the oxygen source. The nitrogen source is preferably selected from the group comprising ammonia, disyliamine, silylamine, tridisylilamine, aminodisylilamine, tetrasilyldiamine and/or disilane derivatives wherein any H may be replaced with $NH_2$ and any mixture of the products of this group). The nitrogen source of another preferred embodiment is trisilylamine. The oxygen and nitrogen sources are fed and controlled with devices known to one skilled in the art.

The deposition and reaction of dielectric precursors in the deposition chamber leads to the formation of a MSiON film on the heated silicon substrate during the forming step 3. One preferred embodiment of a MSiON film is a hafnium silicate film or a zirconium silicate film formed by feeding a hafnium or zirconium metal using a mixture for example of a metal source (such as $Hf(DEA)_4$ or $Zr(DEA)_4$), trisilylamine, and oxygen.

One preferred embodiment of a MSiON film is a hafnium silicon oxynitride film or a zirconium silicon oxynitride film formed by feeding a hafnium or zirconium metal using a mixture of a metal source (such as $Hf(DEA)_4$ or $Zr(DEA)_4$), trisilylamine, ammonia and nitrous oxide.

Referring again to the MSiON method of FIG. 2, the composition of the MSiON dielectric film can be controlled by varying the flow of each of the dielectric precursors independently during the feeding step 2. Particularly, the feed rate of the silicon source and the metal source are independently controllable because the silicon source does not contain any deposition metals. Thus, the silicon source feed rate can be varied independently of the metal source feed rate to affect the desired metal (M) to silicon (Si) ratio. Similarly, the metal source feed rate can be varied without affecting the silicon source feed rate, also changing the M/Si ratio. Because the feed rate of the silicon and metal sources are independently controllable, the M/Si ratio of the resulting dielectric film is controllable over a wide range without changing the composition of the metal source or the silicon source.

Referring to the MSiON method of FIG. 2, the feeding of the dielectric precursors to the deposition chamber results in the formation of a dielectric film of the desired final composition in a single forming step 3. There is no requirement for a post deposition step wherein the composition or structure of the dielectric film is modified after some or all of the dielectric precursors are deposited on the substrate to achieve the desired final composition.

According to the another embodiment, the present invention also relates to a method of forming and composition of a MSiO insulating film on semiconductor pieces. The present invention is applicable to chemical vapor deposition and atomic layer deposition processes as well as others known to one skilled in the art.

Figure 3:
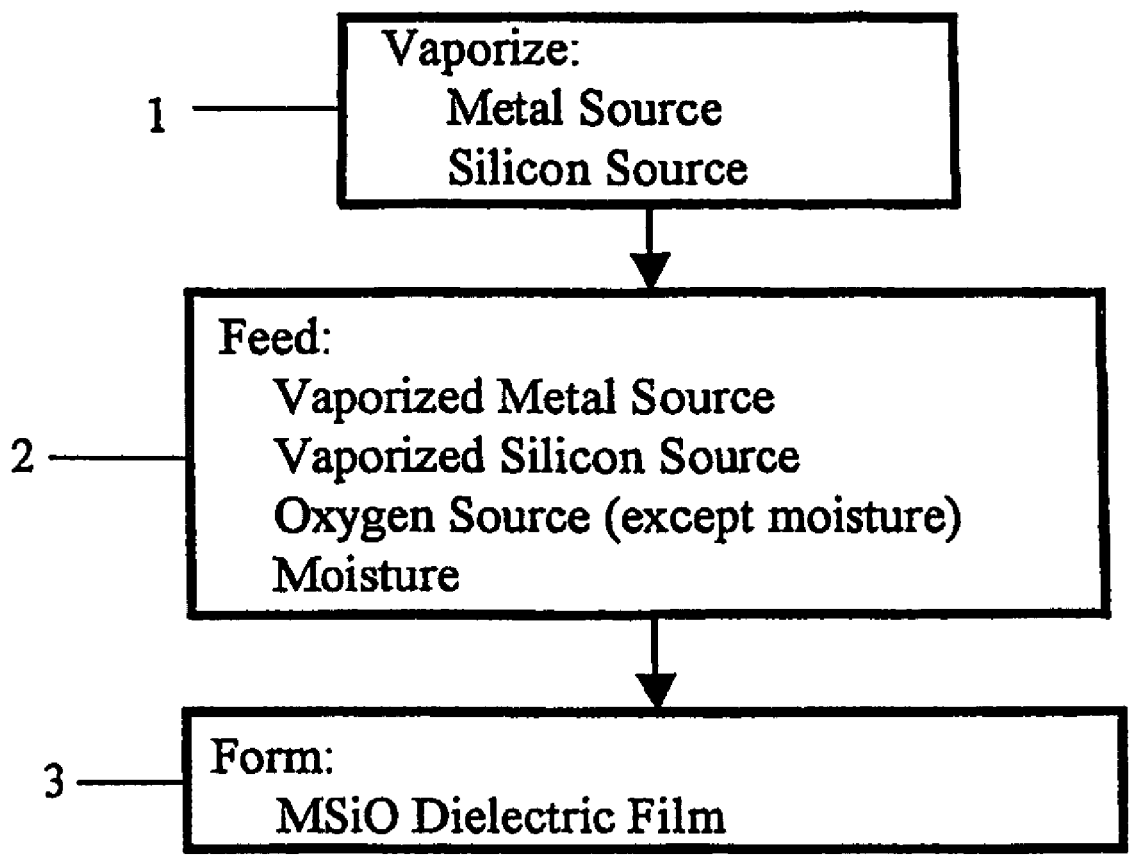
FIG. 3 is a flow chart of the steps of the method according to the invention for forming a MSiO insulating film.
Figure 4:
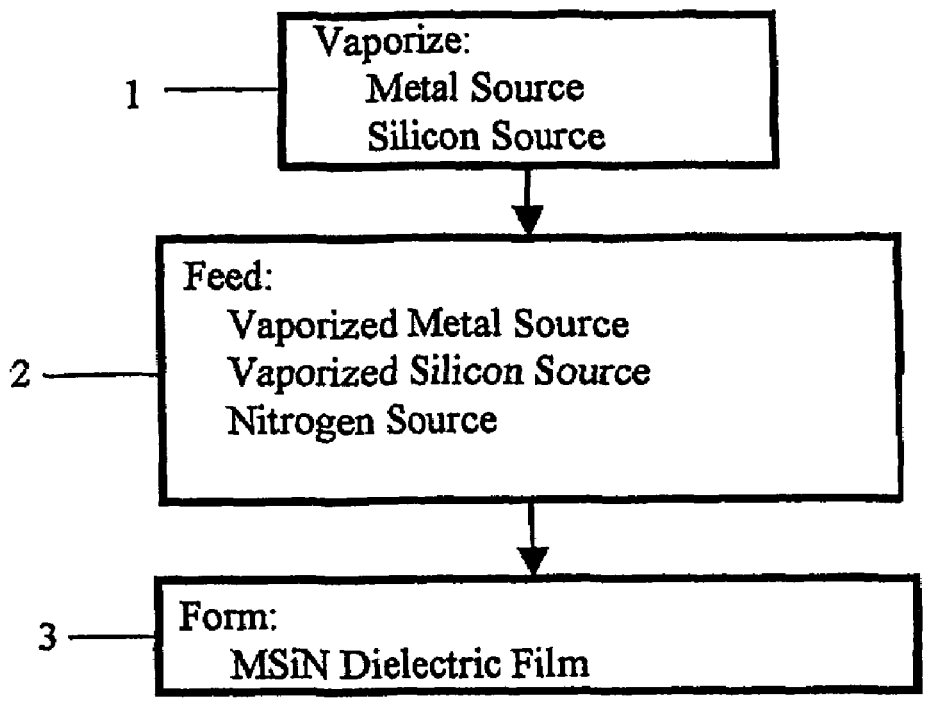
FIG. 4 is a flow chart of a Prior Art method for forming a MSiN metallic film.

Referring to the MSiO method of FIG. 3, the vaporizing step 1 comprises vaporizing a metal source to form a vaporized metal source. The metal source of one preferred embodiment is a precursor solution in liquid phase, preferably a dialkylamino, an alkoxy, or an inorganic compound of hafnium (Hf), zirconium (Zr), titanium (Ti), niobium (Nb), tantalum (Ta), scandium (Sc), yttrium (Y), lanthanum (La), gadolinium (Gd), europium (Eu), or praseodymium (Pr) or any another lanthanide (Ln). Preparing and vaporizing the liquid phase metal precursor solution is carried out in commercially available equipment under appropriate conditions known to one skilled in the art.

Referring again to the MSiO method of FIG. 3, during the feed step 2 a silicon source, an oxygen source, and a nitrogen source (collectively referred to as the dielectric precursors) are fed to a deposition chamber where a substrate (on which deposition is needed) is placed at an elevated temperature. The deposition chamber is typically maintained between about 300 to about 900° C. Preferably the surface of the work piece in the deposition chamber will be between about 500 to about 600° C. The feeding of the dielectric precursors is effectively concurrent (atomic layer deposition involves high-speed sequential pulses of feed materials, which for the purposes of this invention is effectively concurrent).

Referring to the MSiO method of FIG. 3, during the feed step 2 of the MSiO method, the silicon source is controllably injected into the deposition chamber effectively concurrent with the vaporized metal source and the other dielectric precursors or silicon film components. In one preferred embodiment, a silicon source is in the vapor phase at process feed conditions. That is, the silicon source of one preferred embodiment has a vapor pressure of greater than approximately 50 torr at 20° C., sufficient to exist in the vapor phase in the feed control system without the need for vaporization or bubbler equipment in the delivery system. Trisilylamine, one preferred silicon source, may be stored as a liquid, but has sufficient vapor pressure (greater than 300 torr vapor pressure at 25° C.) to be in the vapor phase in the delivery system without the need to use a vaporizer or bubbler system. Disiloxane instead of trisylilamine (or in combination with it) can also be used. Disiloxane is in vapor phase at ambient temperature (boiling point: 15° C.). Because the silicon source is in the vapor phase, it can be accurately measured and controlled with conventional devices know in the art, and is not affected by deposits in a vaporizer or swings in feed conditions during vaporization of the silicon or metal source.

Still referring to the MSiO method of FIG. 3, preferred embodiments of the feed step 2 include, but are not limited to, the use a silicon source absent carbon or chlorine in the molecular structure. Thus, the dielectric film has a minimum amount of contained carbon and chlorine, resulting in the optimum electrical properties.

Still referring to the MSiO method of FIG. 3, preferred embodiments of the feed step 2 include, but are not limited to, feeding the oxygen source into the deposition chamber concurrently with the silicon source. Furthermore, the vaporized metal source is also fed concurrently in the feed step 2. It is not required that nitrogen be fed as a separate stream. The oxygen source can be the same as the metal source or the silicon source. Preferred oxygen sources of the current invention are also free of carbon and/or chlorine in their molecular structures. Preferred embodiments include, but are not limited to oxygen, nitrous oxide, or ozone as the oxygen source. Most preferred embodiment includes moisture. The oxygen and nitrogen sources are fed and controlled with devices known to one skilled in the art.

Referring again to the MSiO method of FIG. 3, the deposition and reaction of dielectric precursors in the deposition chamber leads to the formation of a MSiO film on the heated silicon substrate during the forming step 3. One preferred embodiment of a MSiO film is a hafnium silicate film or a zirconium silicate film formed by feeding a hafnium or zirconium metal using a mixture of a metal source (such as $Hf(DEA)_4$ or $Zr(DEA)_4$), trisilylamine, moisture and oxygen.

Referring again to the MSiO method of FIG. 3, the composition of the MSiO dielectric film can be controlled by varying the flow of each of the dielectric precursors independently during the feeding step 2. Particularly, the feed rate of the silicon source and the metal source are independently controllable because the silicon source does not contain any deposition metals. Thus, the silicon source feed rate can be varied independently of the metal source feed rate to affect the desired metal (M) to silicon (Si) ratio. Similarly, the metal source feed rate can be varied without affecting the silicon source feed rate, also changing the M/Si ratio. Because the feed rate of the silicon and metal sources are independently controllable, the M/Si ratio of the resulting dielectric film is controllable over a wide range without changing the composition of the metal source or the silicon source.

Referring to the MSiO method of FIG. 3, the feeding of the dielectric precursors to the deposition chamber results in the formation of a dielectric film of the desired final composition in a single forming step 3. There is no requirement for a post deposition step wherein the composition or structure of the dielectric film is modified after some or all of the dielectric precursors are deposited on the substrate to achieve the desired final composition.

The silicon precursors of the silicon source may be preferably similar to the list of silicon precursors already disclosed hereabove.

According to still another embodiment, the invention also relates to a method of forming and composition of an MSiN metallic film on semiconductor substratees. The present invention is applicable to chemical vapor deposition and atomic layer deposition processes as well as others known to one skilled in the art.

Figure 5:
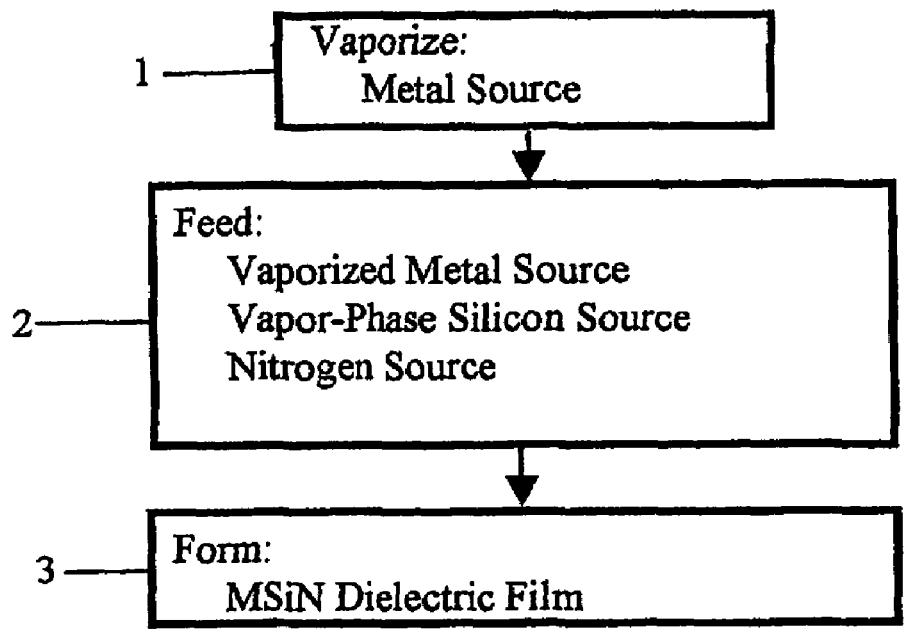
FIG. 5 is a flow chart of the steps of the method of the invention for forming a MSiN metallic film.

Referring to the MSiN method of FIG. 5, the vaporizing step 1 comprises vaporizing a metal source to form a vaporized metal source. The metal source of one preferred embodiment is a precursor solution in liquid phase, preferably a dialkylamino, an alkoxy, or an inorganic compound of hafnium (Hf), zirconium (Zr), titanium (Ti), niobium (Nb), tantalum (Ta), molybdenum, (Mo), tungsten (W), scandium (Sc), yttrium (Y), lanthanum (La), gadolinium (Gd), europium (Eu), or praseodymium (Pr) or any another lanthanide (Ln). Preparing and vaporizing the liquid phase metal precursor solution is carried out in commercially available equipment under appropriate conditions known to one skilled in the art.

Referring again to the MSiN method of FIG. 5, during the feed step 2 a silicon source, and a nitrogen source (collectively referred to as the precursors) are fed to a deposition chamber where a substrate (on which deposition is needed) is placed at an elevated temperature. The deposition chamber is typically maintained between about 300 to about 900° C. Preferably the surface of the work piece in the deposition chamber will be between about 500 to about 600° C. The feeding of the dielectric precursors is effectively concurrent (atomic layer deposition involves high-speed sequential pulses of feed materials, which for the purposes of this invention is effectively concurrent).

Referring to the MSiN method of FIG. 5, during the feed step 2 of the MSiM method, the silicon source is controllably injected into the deposition chamber effectively concurrent with the vaporized metal source and the other dielectric precursors or silicon film components. In one preferred embodiment, a silicon source is in the vapor phase at process feed conditions. That is, the silicon source of one preferred embodiment has a vapor pressure of greater than approximately 50 torr at 20° C., sufficient to exist in the vapor phase in the feed control system without the need for vaporization or bubbler equipment in the delivery system. Trisilane and trisilylamine, two preferred silicon sources, may be stored as a liquid, but has sufficient vapor pressure (greater than 250 torr vapor pressure at 25° C.) to be in the vapor phase in the delivery system without the need to use a vaporizer or bubbler system. Because the silicon source is in the vapor phase, it can be accurately measured and controlled with conventional devices know in the art, and is not affected by deposits in a vaporizer or swings in feed conditions during vaporization of the silicon or metal source.

Still referring to the MSiN method of FIG. 5, preferred embodiments of the feed step 2 include, but are not limited to, the use a silicon source absent carbon or chlorine in the molecular structure. Thus, the dielectric film has a minimum amount of contained carbon and chlorine, resulting in the optimum electrical properties.

Still referring to the MSiN method of FIG. 5, preferred embodiments of the feed step 2 include, but are not limited to, feeding the oxygen and nitrogen sources into the deposition chamber concurrently with the silicon source. Furthermore, the vaporized metal source is also fed concurrently in the feed step 2. Various preferred embodiments of the MSiN method use nitrogen sources that are free of carbon and/or chlorine in their molecular structures. It is not required that nitrogen be fed as a separate stream. The nitrogen source can be the same as the metal source, the silicon source, or the oxygen source. Preferred oxygen sources of the current invention are also free of carbon and/or chlorine in their molecular structures. Preferred embodiments include, but are not limited to oxygen, nitrous oxide, or ozone as the oxygen source. The nitrogen source of one preferred embodiment is ammonia. The nitrogen source of another preferred embodiment is trisilylamine. The nitrogen source is fed and controlled with devices known to one skilled in the art.

Referring again to the MSiN method of FIG. 5, the deposition and reaction of dielectric precursors in the deposition chamber leads to the formation of a MSiON film on the heated silicon substrate during the forming step 3. One preferred embodiment of a MSiN film is a tantalum silicon nitride film or a titanium silicon nitride film formed by feeding a tantalum or titanium metal using a mixture of a metal source (such as $TaCl_5$, $TiCl_4$, $Ta(DMA)_5$ or $Ti(DEA)_4$) and trisilylamine.

Referring again to the MSiN method of FIG. 5, the composition of the MSiN dielectric film can be controlled by varying the flow of each of the dielectric precursors independently during the feeding step 2. Particularly, the feed rate of the silicon source and the metal source are independently controllable because the silicon source does not contain any deposition metals. Thus, the silicon source feed rate can be varied independently of the metal source feed rate to affect the desired metal (M) to silicon (Si) ratio. Similarly, the metal source feed rate can be varied without affecting the silicon source feed rate, also changing the M/Si ratio. Because the feed rate of the silicon and metal sources are independently controllable, the M/Si ratio of the resulting dielectric film is controllable over a wide range without changing the composition of the metal source or the silicon source.

Referring to the MSiN method of FIG. 5, the feeding of the dielectric precursors to the deposition chamber results in the formation of a dielectric film of the desired final composition in a single forming step 3. There is no requirement for a post deposition step wherein the composition or structure of the dielectric film is modified after some or all of the dielectric precursors are deposited on the substrate to achieve the desired final composition.

Silicon and nitrogen sources in accordance with this embodiment are similar to those described hereabove.

EXAMPLES

Example 1

This example relates to the manufacture of hafnium silicon oxynitride films. The CVD tool used in this example is illustrated in FIG. 6. In FIG. 6, a silicon wafer 1 is mounted in a CVD chamber 11 that is provided with a heater over its circumference and the desired film is formed on the surface of the silicon wafer 1. The CVD chamber 11 is evacuated by a pump 12. The metal precursor, in this case tetrakisdiethylaminohafnium $Hf(NEt_2)_4$, is stored in a liquid container 21. Helium gas 22 is used as the carrier gas for the $Hf(NEt_2)_4$. The $Hf(NEt_2)_4$ in the liquid container 21 is transported by the pressure of the helium 22 through a liquid mass flow controller 23 and into a vaporizer 25. Helium 22 is also transported through a mass flow controller 24 into the vaporizer 25. The $Hf(NEt_2)_4$ vaporized by the vaporizer 25 is fed to the CVD chamber 11 along with He. Trisilylamine (TSA) is held in a bottle 31, and this TSA is transported through a mass flow controller 32 to the CVD chamber 11. A line for nitrogen gas 33 is connected along the course of the TSA line and nitrogen gas 33 is fed into the CVD chamber 11 along with the TSA. Oxygen gas 41 (oxidizing agent) is fed through a mass flow controller 42 into the CVD chamber 11. Hafnium silicon oxynitride films were produced under the following conditions using the described CVD tool.

Mode 1-1

Pressure=0.35 torr, temperature=500° C., $Hf(NEt_2)_4$ flow rate=0.5 sccm, He flow rate=180 sccm, TSA flow rate=4 sccm, $O_2$ flow rate=40 sccm, $N_2$ flow rate=25 sccm.

Using this set of conditions, hafnium silicon oxynitride with component ratios of Hf/Si=5:1 and O/N=3:1 was obtained at a film-formation rate of 135 Å/min.

Mode 1-2

Pressure=0.35 torr, temperature=400° C., $Hf(NEt_2)_4$ flow rate=0.5 sccm, He flow rate=180 sccm, TSA flow rate=4 sccm, $O_2$ flow rate=40 sccm, $N_2$ flow rate=25 sccm. This mode was the same as 1-1, with the exception that in this case the temperature was lowered to 400° C.

Using this set of conditions, hafnium silicon oxynitride with component ratios of Hf/Si=6.6:1 and O/N=4:1 was obtained at a film-formation rate of 72 Å/min.

Mode 1-3

Pressure=1.0 torr, temperature=300° C., Hf(NEt$_2$)$_4$ flow rate=0.5 sccm, He flow rate=180 sccm, TSA flow rate=4 sccm, O$_2$ flow rate=100 sccm, N$_2$ flow rate=500 sccm.

Using this set of conditions, hafnium oxynitride was obtained at a film-formation rate of 30 Å/min. Component values for this hafnium oxynitride were O/N=13:1 and silicon in trace amount.

Example 2

Figure 1:
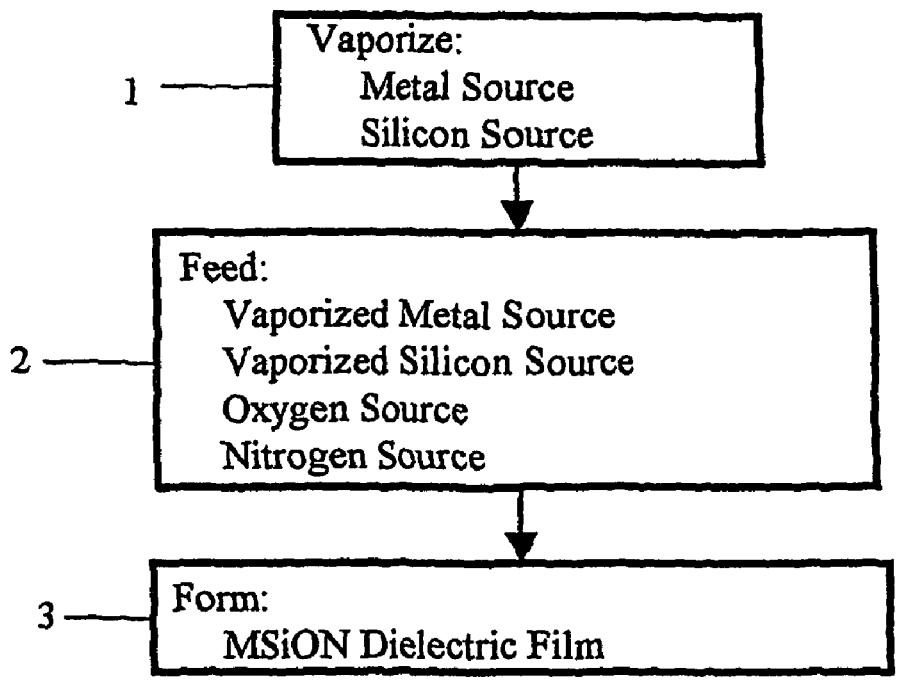
FIG. 1 is a flow chart of a Prior Art method for forming a MSiON insulating film.

This example relates to the manufacture of hafnium silicon oxide film. The CVD tool used in this example is illustrated in FIG. 7. The CVD tool in FIG. 7 has a structure very similar to that of the CVD tool illustrated in FIG. 1, differing from the latter in that a bubbler 43 filled with H$_2$O is provided along the course of the O$_2$ gas 42 line, resulting in the feed into the CVD chamber 11 of H$_2$O along with O$_2$ as the oxidizing agent. Hafnium silicon oxide film was produced under the following conditions using the described CVD tool.

Mode 2-1

Pressure=0.5 torr, temperature=400° C., Hf(NEt$_2$)$_4$ flow rate=0.5 sccm, He flow rate=160 sccm, TSA flow rate=4 sccm, O$_2$ flow rate=40 sccm, H$_2$O flow rate=1.2 sccm, N$_2$ flow rate=20 sccm.

Using this set of conditions, hafnium silicon oxide (C below the detection limit) with a component ratio of Hf/Si=3.5:1 was obtained at a film-formation rate of 135 Å/min.

Example 3

This example concerns the fabrication of silicon-doped titanium nitride films. The CVD tool used in this example is illustrated in FIG. 8. In FIG. 8, a silicon wafer is mounted in a CVD chamber 11 that is provided with a heater over its circumference and the desired film is formed on the surface of the silicon wafer 1. The CVD chamber 11 is evacuated by the pump 12. The metal precursor, in this case titanium tetrachloride TiCl$_4$, is held in a bubbler 51 and TiCl$_4$ vapor is fed to the CVD chamber 11. Trisilylamine (TSA) is held in the bottle 31, and this TSA is transported along with N$_2$ gas through the mass flow controller 32 to the CVD chamber 11. The offgas from the CVD chamber is exhausted through an adsorber 13. Silicon-doped titanium nitride films were produced under the following conditions using the described CVD tool.

Mode 3-1

Pressure=1 torr, temperature=625° C., TiCl$_4$ flow rate=5 sccm, TSA flow rate=4 sccm, N$_2$ flow rate=20 sccm, time=15 minutes.

According to AES analysis, the resulting film was titanium nitride with the stoichiometric composition that contained trace amounts of silicon. This film was about 4000 Å thick. The film-formation rate was approximately 270 Å/min.

Mode 3-2

Pressure=1 torr, temperature=550° C. (this film-formation temperature was substantially lower than the prior-art film-formation temperatures using TiCl$_4$/NH$_3$), TiCl$_4$ flow rate=5 sccm, TSA flow rate=4 sccm, N$_2$ flow rate=20 sccm, time=15 minutes.

According to AES analysis, the resulting film was titanium nitride with the stoichiometric composition that contained trace amounts of silicon. This film was about 290 Å thick. The film-formation rate was approximately 19 Å/min.

Example 4

Atomic Layer Deposition of HfSiO from alternative pulses of Hf(NEt2)4, ozone and
TSA
P=0.5 Torr, T=350C
Hf(NEt2)4 (0.25 sccm) with carrier gas (N2:25 sccm):7 sec
TSA (1 sccm):3 sec
O3 (2.5 sccm) mixed with O2 (50 sccm):5 sec
N2:70 sccm (continuous)

The deposition of hafnium silicon oxide (Hf$_{0.75}$Si$_{0.25}$O$_2$) was obtained in these experimental conditions.

Example 5

Deposition of TaN from TaCl5 and TSA (CVD)
Furnace:500C-1 Torr (The reactor is a hot wall type)
FR TSA:5 sccm (FR:flow rate)
FR NH3:20 sccm
FR TaCl5:5 sccm (+FR N2 carrier gas:20 sccm)
10 minute deposition.

The deposition of tantalum nitride was obtained with silicon at trace level.

Example 6

Atomic Layer Deposition of TaN from TaCl5 and TSA
Reactor:150 C. Susceptor:T=300C–P=2 Torr (The reactor is a cold wall type, i.e. the wafer is deposited through a susceptor underneath)
FR TSA:1 sccm
FR TaCl5:0.5 sccm (+FR Ar carrier gas:42 sccm)
40 cycles The deposition of tantalum nitride was obtained with silicon at trace level.

Although the present invention has been described in considerable detail with reference to certain preferred versions thereof, other versions are possible. For example, the composition and method may be practiced in a process other then chemical vapor deposition or atomic layer deposition. In addition, the deposition of dielectric films can be accomplished at a variety of temperature and conditions. Furthermore, the invention may include a variety of metal, silicon and nitrogen sources known in the art. Therefore, the spirit and scope of the appended claims should not be limited to the description of one of the preferred versions contained herein. The intention of the applicants is to cover all modifications, equivalents, and alternatives falling within the spirit and scope of the invention as defined by the appended claims.

It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

What is claimed is:

1. A method for forming a MSiN dielectric film comprising the steps of:
   a) vaporizing a metal source (M) to form a vaporized metal source;
   b) providing a vapor phase silicon source, wherein said silicon source has a vapor pressure of at least 50 torr at about 20° C.;
   c) feeding a plurality of precursors to a deposition device having a substrate disposed therein, wherein said precursors comprise said vaporized metal source, said silicon source, and a nitrogen source; wherein said nitrogen source and said silicon source comprise respective molecular structures absent carbon; and d) forming the MSiN dielectric film on the substrate, wherein said dielectric film is formed from the said precursors in a single step such that the MSiN dielectric film is fully formed absent a post deposition step.

2. A method for forming a MSiO metallic film comprising the steps of:

a) vaporizing a metal source to form a vaporized metal source;

b) providing a vapor phase silicon source, wherein said silicon source has a vapor pressure of at least 50 torr at about 20° C.;

c) feeding a plurality of precursors to a deposition device having a substrate disposed therein, wherein said precursors comprise said vaporized metal source, said silicon source, and an oxygen source; wherein said oxygen source and said silicon source comprise respective molecular structures absent carbon; and d) forming the MSiO metallic film on the substrate, wherein said metallic film is formed from the said precursors in a single step such that the MSiO metallic film is fully formed absent a post deposition step.

3. The method of claim 1, wherein said silicon source is selected from the group comprising:
a) disiloxane;
b) trisilylamine;
c) disilylamine;
d) silylamine;
e) tridisilylamine;
f) aminodisilylamine;
g) tetrasilyldiamine;
h) disilane;
i) derivatives of disilane and/or trisilane; and
j) mixtures thereof.

4. The method of claim 2, wherein said oxygen source is selected from the group comprising:
a) oxygen
b) nitrous oxide;
c) ozone;
d) disiloxane; and
e) mixtures thereof.

5. The method of claim 1, wherein said nitrogen source is the same as said metal source or said silicon source.

6. The method of claim 1, wherein said nitrogen source is ammonia.

7. The method of claim 1, wherein said metal source is selected from the group consisting of a dialkylamino, and alkoxy ligands.

8. The method of claim 1, wherein said metal source is an inorganic compound selected from the group consisting of:
a) hafnium (Hf);
b) zirconium (Zr);
c) titanium (Ti);
d) niobium (Nb);
e) tantalum (Ta);
f) scandium (Sc);
g) yttrium (Y);
h) lanthanum (La);
i) gadolinium (Gd);
j) europium (Eu);
k) praseodymium (Pr) or any another lanthanide (Ln); and
l) mixtures thereof.

9. The method of claim 1, wherein the amounts of said metal source and said silicon source in said desired final composition of said dielectric film are controlled independently.

10. The method of claim 1, wherein said dielectric film is completed by using a chemical vapor deposition process.

11. The method of claim 1, wherein said dielectric film step is completed by using an atomic layer deposition process.

12. A MSiN dielectric film obtained in accordance with the process of claim 1.

13. A MSiO metallic film obtained in accordance with the process of claim 2.

14. The method of claim 2, wherein said silicon source is selected from the group comprising:
a) disiloxane;
b) trisilylamine;
c) disilylamine;
d) tridisilylamine;
e) aminodisilylamine;
f) tetrasilyldiamine;
g) derivatives of disilane and/or trisilane; and
h) mixtures thereof.

15. The method of claim 2, wherein said oxygen source is the same as said metal source or said silicon source.

16. The method of claim 2, wherein said metal source is an inorganic compound selected from the group consisting of:
a) hafnium (Hf);
b) zirconium (Zr);
c) titanium (Ti);
d) niobium (Nb);
e) tantalum (Ta);
f) scandium (Sc);
g) yttrium (Y);
h) lanthanum (La);
i) gadolinium (Gd);
j) europium (Eu);
k) praseodymium (Pr) or any another lanthanide (Ln); and
l) mixtures thereof.

17. The method of claim 2, wherein the amounts of said metal source and said silicon source in said desired final composition of said dielectric film are controlled independently.

18. The method of claim 1, wherein the post deposition step is an anneal step, whereby the MSiN dielectric film is fully formed on the substrate to produce a desired final film without subjecting the MSiN dielectric film an anneal step.

19. The method of claim 2, wherein the post deposition step is an anneal step, whereby the MSiO metallic film is fully formed on the substrate to produce a desired final film without subjecting the MSiO metallic film an anneal step.

* * * * *